United States Patent
Gowrishankar et al.

(10) Patent No.: US 12,212,322 B2
(45) Date of Patent: Jan. 28, 2025

(54) CLOCK DRIVER WITH DUTY CYCLE CORRECTION

(71) Applicant: Advanced Micro Devices, Inc., Santa Clara, CA (US)

(72) Inventors: Raghavendra Rukmani Gowrishankar, Bangalore (IN); Milind Gopal Agrawal, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 18/196,253

(22) Filed: May 11, 2023

(65) Prior Publication Data

US 2024/0380391 A1    Nov. 14, 2024

(51) Int. Cl.
| | |
|---|---|
| H03K 3/03 | (2006.01) |
| H03K 3/013 | (2006.01) |
| H03K 3/017 | (2006.01) |
| H03K 5/156 | (2006.01) |

(52) U.S. Cl.
CPC ............. *H03K 3/03* (2013.01); *H03K 3/013* (2013.01); *H03K 3/017* (2013.01); *H03K 5/1565* (2013.01)

(58) Field of Classification Search
None
See application file for complete search history.

(56) References Cited

U.S. PATENT DOCUMENTS 9,197,142 B2 *  11/2015  Adachi ................. H02N 2/004

* cited by examiner

*Primary Examiner* — Cassandra F Cox
(74) *Attorney, Agent, or Firm* — Polansky & Associates, P.L.L.C.; Paul J. Polansky

(57) ABSTRACT

A clock driver with duty cycle correction includes a first driver circuit, a second driver circuit, and a correction logic circuit. The first driver circuit performs duty cycle correction on a clock input signal and has parameters selected for a first frequency range of the clock input signal. The second driver circuit is nested with the first driver circuit and performs duty cycle correction on the clock input signal with parameters selected for a second frequency range of the clock input signal lower than the first frequency range. The correction logic circuit provides correction signals to a selected one of the first driver circuit and the second driver circuit. The clock driver provides a duty cycle corrected clock signal from the selected one of the first driver circuit and the second driver circuit based on a selected frequency range of the clock input signal.

20 Claims, 6 Drawing Sheets

CLOCK DRIVER WITH DUTY CYCLE CORRECTION

BACKGROUND

This disclosure relates generally to clock circuits, and more specifically to clock driver circuits with duty cycle correction (DCC). Providing a symmetrical duty cycle clock signal is important for many high-speed interface designs. For example, modern dynamic random-access memories (DRAMs) based on the double data rate (DDR) family of standards promulgated by the Joint Electrical Design Engineering Conference (JEDEC) use high-speed data transmission between a data processor and a DDR memory. Currently supported data rates can require a clock or strobe signal having a frequency as high as a few giga-Hertz (GHz). DDR memories are also typically operated in lower memory power states during periods of low processor activity in which the data transmission frequency is lowered. Moreover, in DDR systems, data is captured on both low-to-high and high-to-low transitions of the data clock or data strobe signal, making it important for the data clock or data strobe signal to achieve a duty cycle very close to 50%. Any significant duty cycle error may close the data eye and prevent reliable data reception.

A traditional method of duty cycle correction is to use an analog negative feedback loop. However analog feedback loops are slow and difficult to stabilize, and require a continuously running clock signal for the loop to track and maintain the output duty cycle, increasing device power consumption. Analog feedback loops also suffer from burst mode and clock random jitter issues. In these systems, analog loops are shut down to save power during periods of inactivity, but can suddenly switch to periods of high activity, which causes power supply transients that affect the duty cycle of the clock signal.

Because of the problems with analog feedback loops, digital duty cycle correction (DCC) loops have been developed. However digital DCC loops can suffer from a least significant bit (LSB) step size problem when used in clock generation circuits that require wide frequency ranges, such as DDR memory systems. For example, if the frequency range-to-step size ratio is tuned for the highest supported frequency, then it may fail to properly correct duty cycle to an acceptable amount of accuracy at the lowest supported frequency, and vice versa. There exists no known solution for digital duty cycle correction circuits that provide the needed accuracy over wide frequency ranges such as those required for DDR memory systems.

Figure 1:
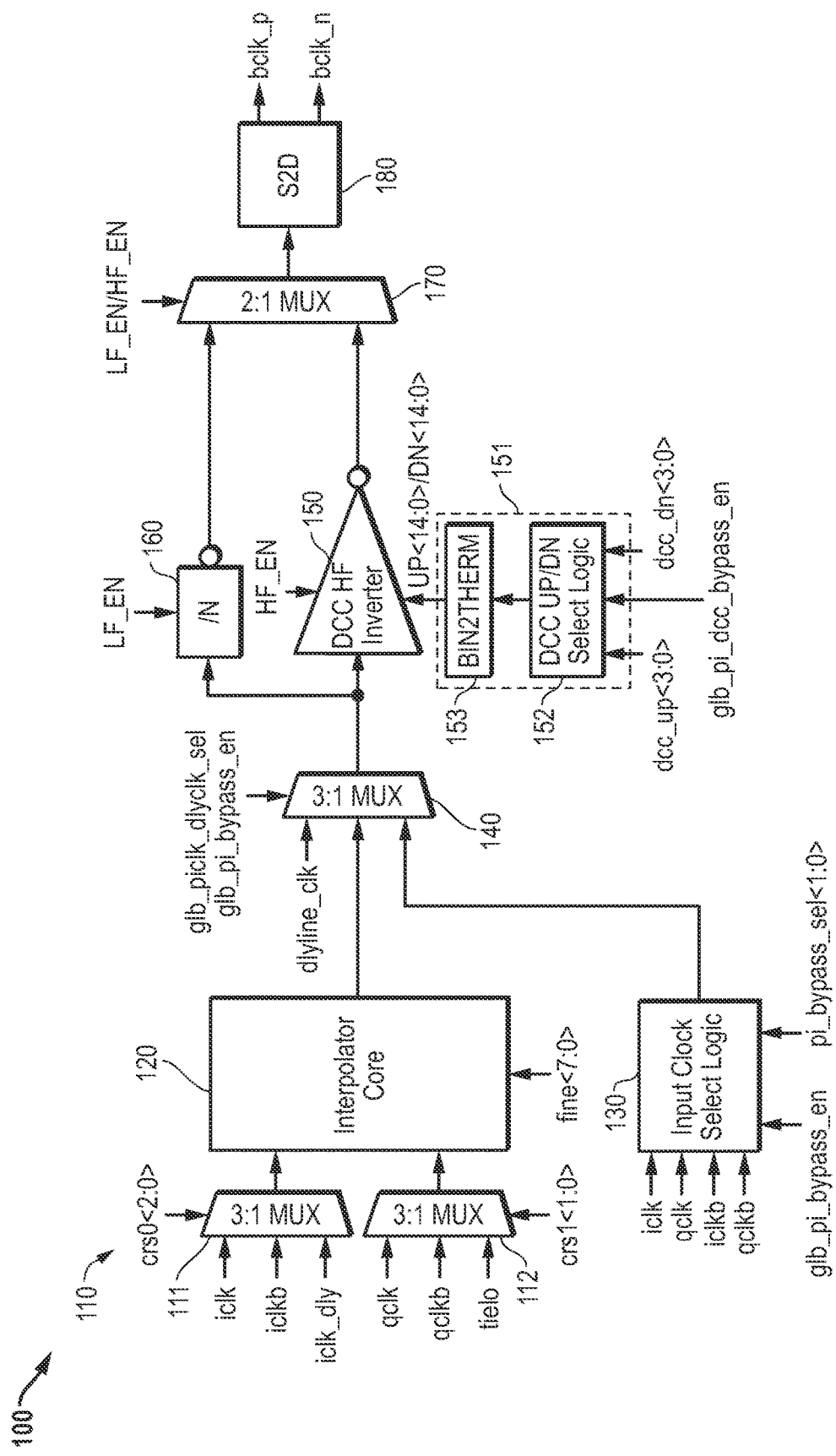
FIG. 1 illustrates in block diagram form a clock driver circuit known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. The following Detailed Description is directed to electrical circuitry, and the description of a block shown in a drawing figure implies the implementation of the described function using suitable electronic circuitry, unless otherwise noted.

DETAILED DESCRIPTION OF ILLUSTRATIVE EMBODIMENTS

A clock driver with duty cycle correction includes a first driver circuit, a second driver circuit, and a correction logic circuit. The first driver circuit performs duty cycle correction on a clock input signal and has parameters selected for a first frequency range of the clock input signal. The second driver circuit is nested with the first driver circuit and performs duty cycle correction on the clock input signal with parameters selected for a second frequency range of the clock input signal lower than the first frequency range. The correction logic circuit provides correction signals to a selected one of the first driver circuit and the second driver circuit. The clock driver provides a duty cycle corrected clock signal from the selected one of the first driver circuit and the second driver circuit based on a selected frequency range of the clock input signal.

A clock driver with duty cycle correction includes a first driver circuit, at least one nested driver circuit, and a correction logic circuit. The first driver circuit performs duty cycle correction on a clock input signal with parameters selected for a first frequency range of the clock input signal. The at least one nested driver circuit is coupled to and nested with a preceding driver circuit, each nested driver circuit performs duty cycle correction on the clock input signal with parameters selected for corresponding additional frequency ranges of the clock input signal. The correction logic circuit provides correction signals to the first driver circuit and the at least one nested driver circuit. The clock driver provides a duty cycle corrected clock signal from a selected one of the first driver circuit and the at least one nested driver circuit based on a frequency range of the clock input signal.

A method includes performing duty cycle correction on a clock input signal using a first driver circuit having parameters selected for a first frequency range of the clock input signal. A second driver circuit is nested with the first driver circuit. Duty cycle correction on the clock input signal is performed using the second driver circuit, wherein the second driver circuit has parameters selected for a second frequency range of the clock input signal, the second frequency range different from the first frequency range. Correction signals are provided to a selected one of the first driver circuit and the second driver circuit. A duty cycle corrected clock signal is provided from an output of the first driver circuit if the clock input signal is in the first frequency range, and from the second driver circuit if the clock input signal is in the second frequency range.

FIG. 1 illustrates in block diagram form a clock driver circuit 100 known in the prior art. Clock driver circuit 100 includes generally a selector block 110, an interpolator core 120, an input clock select logic circuit 130, a multiplexer 140 labelled "MUX", a duty cycle correction inverter 150, a programmable divider 160, an output multiplexer 170, and a single-ended to differential converter 180 labelled "S2D".

Selector block 110 includes multiplexers 111 and 112, each labelled "3:1 MUX". Multiplexer 111 has inputs for receiving an in-phase clock labelled "iclk", a complement of the in-phase clock labelled "iclkb", and a delayed version of the in-phase clock labelled "iclk_dly", a control input for receiving a select signal labeled "crs0<2:0>", and an output. Multiplexer 112 has inputs for receiving a quadrature clock labelled "qclk", a complement of the quadrature clock labelled "qclkb", a value representative of a logic low voltage labelled "tielo", a control input for receiving a select signal labeled "crs1<1:0>", and an output. Selector block 110 allows a user to select from among a variety of clock sources to perform various functions. For example, in a radio application, the iclk and qclk signals form in-phase and quadrature signals of a data communication system, in which the clocks are ninety degrees out of phase so as to be able to modulate a signal to be transmitted or demodulate a signal to be received.

Interpolator core 120 has an in-phase input connected to the output of multiplexer 111, a quadrature input connected to the output of multiplexer 112, a control input for receiving a set of control bits labelled "fine<7:0>", and an output.

Input clock select logic circuit 130 has inputs for receiving signals iclk, qclk, iclkb, and qclkb, a control input for receiving an enable signal labelled "glb_pi_bypass_en", a control input for receiving a control signal labelled "pi_bypass_sel<1:0>, and an output. Input clock select logic circuit 130 is enabled when the glb_pi_bypass_en signal is active at a logic high, and is disabled when the glb_pi_bypass_en signal is inactive at a logic low. When active, the two-bit pi_bypass_sel<1:0> signal selects between the four inputs.

Multiplexer 140 has a first input for receiving a signal labelled "dly_line_clk", a second input connected to the output of interpolator core 120, a third input connected to the output of input clock select logic circuit 130, control inputs for receiving signals labelled "glb_piclk_dlyclk_sel" and "glb_pi_bypass_en", and an output. Multiplexer 140 selects its first input in response to the inactivation of the glb_pi_bypass_en signal and activation of glb_piclk_dlyclk_sel, its second input in response to the inactivation of the glb_piclk_dlyclk_sel and glb_pi_bypass_en signals, and its third input in response to the inactivation of the glb_piclk_dlyclk_sel signal and the activation of the glb_pi_bypass_en signal.

Duty cycle correction inverter 150 has an input connected to the output of multiplexer 140, a control input for receiving an enable signal labelled "HF_EN", and a duty cycle correction input for receiving signals labelled "UP<14:0>" and "DN<14:0>", and an output. A signal generator circuit 151 associated with duty cycle correction inverter 150 includes a duty cycle control up/down selection logic circuit 152 labelled "DCC UP/DN Select Logic", and a binary-to-thermometer encoder circuit 153 labelled "BIN2THERM". Duty cycle control up/down selection logic circuit 152 has a first input for receiving a signal labelled "dcc_up<3:0>", a second input for receiving a signal labelled "dcc_dn<3:0>", a control input for receiving a control signal labelled "dcc_pi_dcc_bypass_en", and an output. Binary-to-thermal converter 153 has an input connected to the output of duty cycle control up/down selection logic circuit 152, and an output for providing the UP<14:0> and DN<14:0> signals.

Programmable divider 160 has an input connected to the output of multiplexer 140, a control input for receiving a low frequency enable signal labelled "LF_EN", and an inverting output.

Output multiplexer 170 has a first input connected to the output of programmable divider 160, a second input connected to the output of duty cycle correction inverter 150, a control input for receiving a control signal labelled "LF_EN/HF_EN", and an output. Single-ended to differential converter 180 has an input connected to the output of output multiplexer 170, a first output for providing a positive signal of a differential signal pair labelled "bclk_p", and a second output for providing a negative signal of the differential signal pair labelled "bclk_n".

In operation, duty cycle correction inverter 150, programmable divider 160, and output multiplexer 170 form a core clock driver circuit that can be used alone or in combination with other circuitry to achieve duty cycle correction. Clock driver circuit 100 illustrates an example of a conventional clock driver circuit that also provides interpolation and flexible selection between several clock sources. A clock driver duty cycle correction circuit, not shown in FIG. 1, measures the actual duty cycle real-time and provides correction signals dcc_up<3:0> and dcc_dn<3:0> to compensate for duty cycle error caused by, for example, an imbalance between the P-channel pullup side and the N-channel pulldown side of duty cycle correction inverter 150, power supply droop, temperature change, etc. Signal generator circuit 151 receives and latches the duty cycle control signals, and binary-to-thermometer encoder circuit 153 converts the duty cycle control signals to a form suitable for use in duty cycle correction inverter 150. When inactive at a logic high state, the glb_pi_dcc_bypass_en signal allows the duty cycle correction to be disabled under certain conditions, such as test modes and for very low frequency operation when data eye closure due to clock duty cycle error is not likely to occur. When active in a logic low state, the glb_pi_dcc_bypass_en signal enables the dcc_up<3:0> and dcc_dn<3:0> signals to be passed to the control input of duty cycle correction inverter 150. Binary-to-thermometer encoder circuit 153 then converts the dcc_up<3:0> and dcc_dn<3:0> signals to thermometer encoded signals, in which the UP<14:0> signals and DN<14:0> signals have ones in positions at or below the respective "thermometer" level, and zeros above the respective thermometer level.

In addition, clock driver circuit 100 provides some amount of flexibility in clock frequency due to the availability of either a high-frequency path through duty cycle correction inverter 150 enabled by the HF_EN signal, or a low-frequency path through programmable divider 160. Duty cycle correction inverter 150 provides duty cycle correction in response to the dcc_up<3:0> and dcc_dn<3:0> signals that can be selected based on real-time measurements of the duty cycle, not shown in FIG. 1 but described below. Programmable divider 160 does not have explicit duty cycle correction, but inherently achieves duty cycle correction by forming a divided clock cycle based on whole cycles of the input clock signal, and thus is not affected by variations in the high and low times of the input clock signal.

Clock driver circuit 100 suffers from power consumption issues, because a low frequency output signal is derived using a high frequency input to programmable divider 160. It also causes deterministic jitter issues due to the presence of a fundamental high frequency input along with divided output frequencies. On the other hand, clock driver circuit 100, without programmable divider 160, is also a feasible solution. However, the duty cycle correction range is limited because it suffers from the LSB step size issue. That is, if the LSB step size is optimized for the highest operating frequency, then it offers very limited LSB step size at the lowest operating frequency and vice-versa. A circuit that can be used to provide wideband digital duty cycle correction circuit across a wide operating frequency range will be described below.

Figure 2:
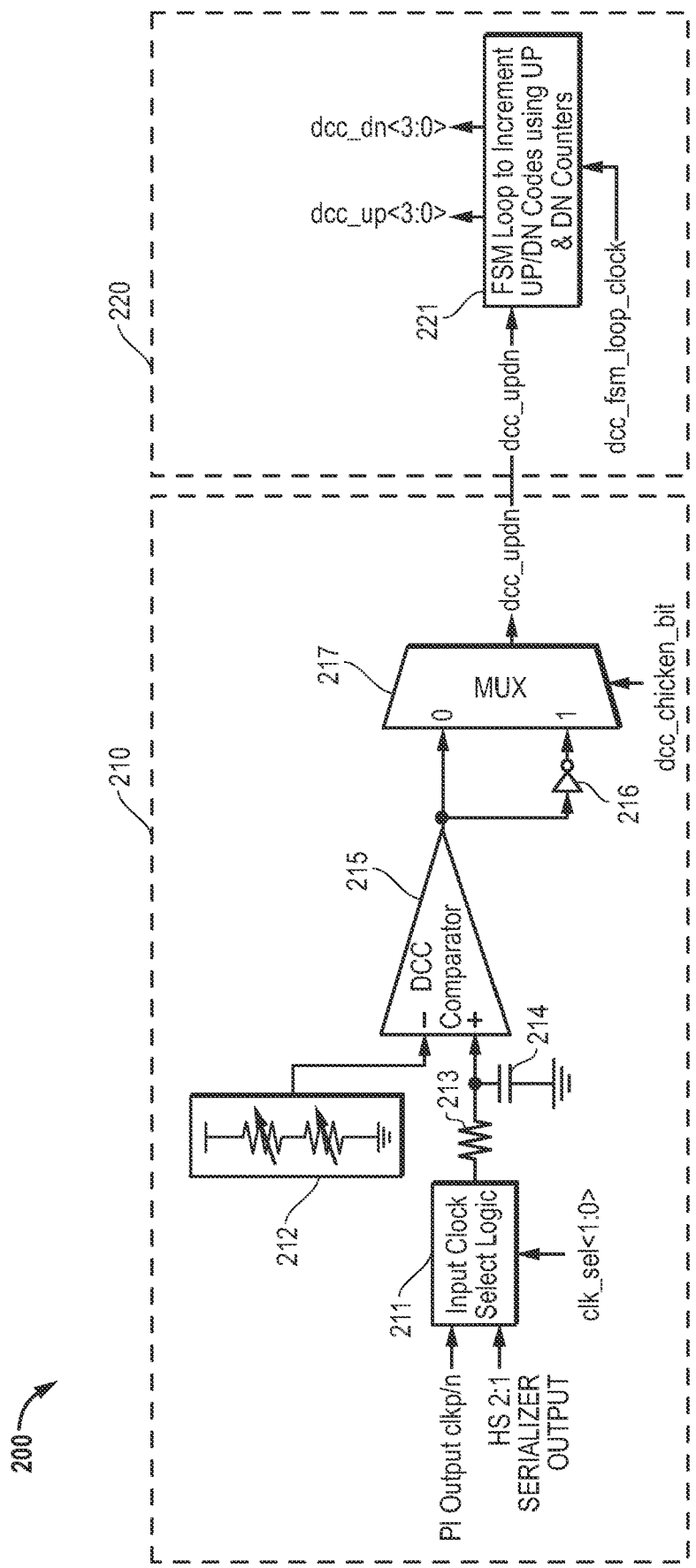
FIG. 2 illustrates in partial block diagram and partial schematic form a duty cycle correction circuit known in the prior art.

FIG. 2 illustrates in partial block diagram and partial schematic form a duty cycle correction circuit 200 known in the prior art. Duty cycle correction circuit 200 includes generally a correction signal generator 210 and an accumulator 220.

Correction signal generator 210 includes an input clock selection logic circuit 211, a reference voltage generator 212, a resistor 213, and capacitor 214, a comparator 215, an inverter 216, and a multiplexer 217. Input clock selection logic circuit 211 has a first input for receiving an interpolator output labelled "PI Output clkp/n", a second input for receiving the output of output multiplexer 170 of FIG. 1 labelled "HS 2:1 SERIALIZER OUTPUT", a selection input for receiving a selection signal labelled "clk_sel<1:0>", and an output. Voltage generation circuit 212 has an output for receiving a reference voltage, and as shown in FIG. 2, and is represented as a resistor divider with tunable resistors connected in series between a power supply voltage terminal and a ground terminal. Resistor 213 has a first terminal connected to the output of input clock selection logic circuit 211, and a second terminal. Capacitor 214 has a first terminal connected to the second terminal of resistor 213, and a second terminal connected to the ground terminal. Comparator 215 has a negative input connected to the output of reference voltage generator 212, a positive input connected to the first terminal of capacitor 214, and an output. Inverter 216 has an input connected to the output of comparator 215, and an output. Multiplexer 217 has a first input labelled "0" connected to the output of comparator 215, a second input labelled "1" connected to the output of inverter 216, a control input for receiving a signal labelled "dcc_chicken_bit", and an output for providing a signal labelled "dcc_updn".

Accumulator 220 is implemented with a digital finite state machine 221 that has an input connected to the output of multiplexer 217, a clock input for receiving a clock signal labelled "dcc_fsm_loop_clk", a first output for providing the dcc_up<3:0> signal, and a second output for providing the dcc_down<3:0> signal.

In operation, correction signal generator 210 forms the dcc_updn signal to indicate whether the duty cycle is measured at less than 50% or greater than 50%. The clk_sel<1:0> signal selects either the "p" or "n" portion of either the first or second input as the clock source. Reference voltage generator 212 provides an output that represents the midpoint of the power supply voltage measured with respect to ground. As shown in FIG. 2, it has the ability to be tuned to provide the midpoint value as a precise voltage. Resistor 213 and capacitor 214 form a lowpass filter that provides an average voltage of the selected clock signal on the first terminal of capacitor 214. If the average value exceeds the precise midpoint voltage, then the duty cycle of the high state is greater than 50%, whereas if the average value is less than the precise midpoint voltage, then the duty cycle of the high state is less than 50%. Multiplexer 217 is responsive to either the true output of comparator 215 if its control input is low, or the complement of the output of comparator 215 if its control input is high, based on its control input. Thus the dcc_updn signal represents the state of whether the duty cycle is above or below 50%.

Digital finite state machine 221 operates according to the dcc_fsm_loop_clock to capture the value of the dcc_updn signal. The dcc_fsm_loop_clock operates slower than the clock being switched to provide loop stability. In some embodiments, digital finite state machine 221 includes a digital noise filter that changes the values of dcc_up<3:0> signal relative to the dcc_dn<3:0> based on recent samples to avoid loop instability based on random fluctuations in the duty cycle. If the clock is precisely at a 50% duty cycle, the number of occurrences of dcc_updn=1 will equal the number of occurrences of dcc_updn=0. After counting a threshold number of occurrence of dcc_updn being in a certain logic state, it either increments or decrements the dcc_up<3:0> signal relative to the dcc_dn<3:0> signal as indicated by the logic state of dcc_updn.

Figure 3:
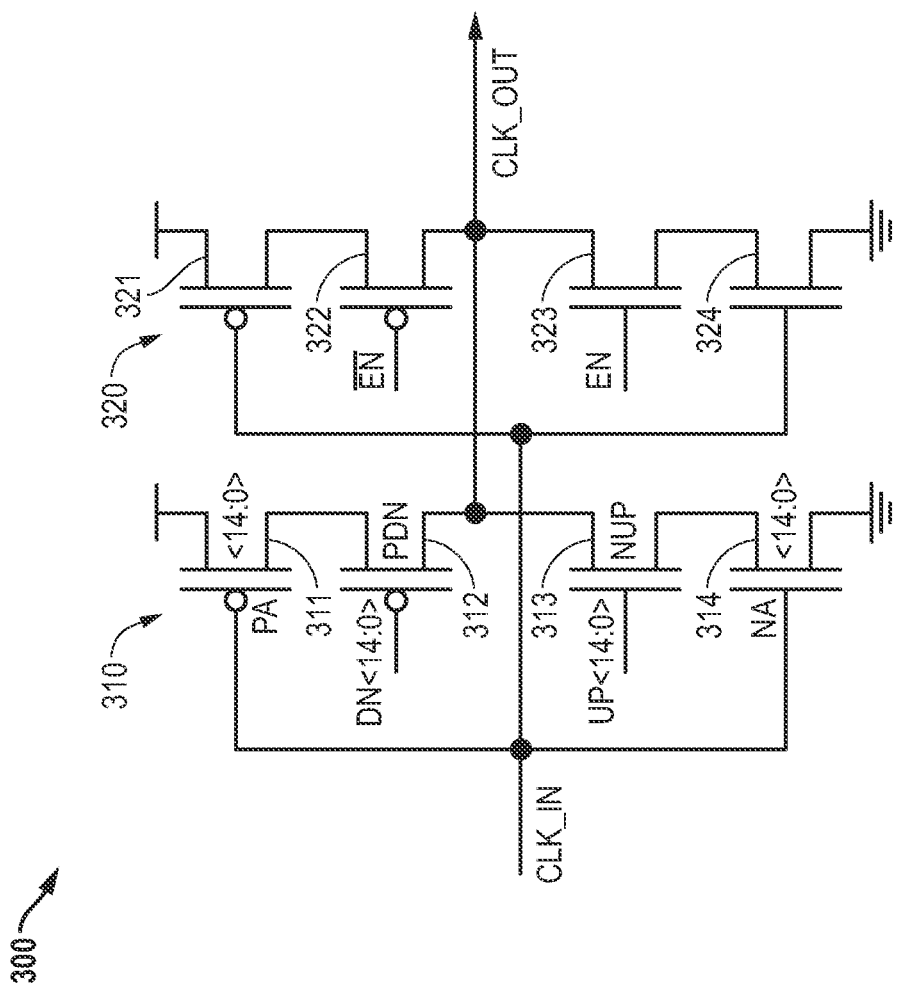
FIG. 3 illustrates in schematic form a duty cycle correction inverter that can be used as the duty cycle correction inverter in the clock driver of FIG. 1 according to the prior art.

FIG. 3 illustrates in schematic form a duty cycle correction inverter 300 that can be used as duty cycle correction inverter 150 in clock driver circuit 100 of FIG. 1 according to the prior art. Duty cycle correction inverter 300 includes generally a first stage 310 and a second stage 320, in which first stage 310 and second stage 320 are connected in parallel.

First stage 310 operates as a tunable impedance inverter and includes compound transistors 311-314. Compound transistor 311 is a compound P-channel transistor having fifteen equally sized transistor segments, each having a source connected to the power supply voltage terminal, a gate for receiving an input signal labelled "CLK_IN", and a drain. Compound transistor 312 is a compound P-channel transistor having fifteen equally sized transistor segments, each having a source connected to the drain of a corresponding transistor segment in compound transistor 311, a gate for receiving a corresponding one of the DN<14:0> signal, and a drain for providing an output signal labelled "CLK_OUT". Compound transistor 313 is a compound N-channel transistor having fifteen equally sized transistor segments, each having a drain connected to the drain of a corresponding transistor in compound transistor 312, a gate for receiving a corresponding one of the UP<14:0> signals, and a source. Compound transistor 314 is a compound N-channel transistor having fifteen equally sized transistor segments, each having a drain connected to the source of a corresponding transistor in compound transistor 313, a gate for receiving the CLK_IN signal, and a source connected to ground.

Second stage 320 operates an as constant-impedance inverter and includes transistors 321-324. Transistor 321 is a P-channel transistor having a source connected to the power supply voltage terminal, a gate for receiving the CLK_IN signal, and a drain. Transistor 322 is a P-channel transistor having a source connected to the drain of transistor 321, a gate for an active low enable signal labeled "$\overline{EN}$", and a drain connected to the drains of each transistor in compound transistor 312. Transistor 323 in an N-channel transistor having a drain connected to the drain of transistor 322, a gate for receiving an active high enable signal labelled "EN", and a. Transistor 324 is an N-channel transistor having a drain connected to the source of transistor 323, a gate for receiving the CLK_IN signal, and a source connected to ground. When used in clock driver circuit 100 of FIG. 1, the gates of transistors 322 and 323 receive a complement of the HF_EN signal and the HF_EN signal, respectively. The drains of all segments of transistors 312, 313, 322, and 323 are connected together to form the CLK_OUT signal at the output of duty cycle correction inverter 300.

Duty cycle correction inverter 300 allows the duty cycle to be corrected by adjusting the pullup and pulldown impedances in first stage 310 according to the DN<14:0> and UP<14:0> signals, respectively. Compound transistor 311 operates as a pullup transistor with segments connected to corresponding segments in compound transistor 312 in a cascode configuration. Each segment in compound transistor 311 has the same size as every other segment, and each segment in compound transistor 312 has the same size as every other segment. Likewise, compound transistor 314 operates as a pulldown transistor with segments connected to corresponding segments in compound transistor 313 in a cascode configuration. Each segment in compound transistor 314 has the same size as every other segment in compound transistor 314, and each segment in compound transistor 313 has the same size as every other segment in compound transistor 313. Thus, both the switching transistors and the cascode transistors can be physically matched to each other and provide uniform increases in impedance and rise- and fall-times as more cascode transistors are switched in.

When the CLK_IN signal switches from low to high, the CLK_OUT signal switches from high to low. The rate at which it switches depends on the load impedance and the effective cascode impedance. As more of the thermometer-encoded DN<14:0> signals become active, the pullup impedance decreases, effectively decreasing the high time and the duty cycle. Conversely, when the CLK_IN signal switches from high to low, the CLK_OUT signal switches from low to high. The rate at which it switches depends on the load impedance and the effective cascode impedance. As more of the thermometer-encoded UP<14:0> signals become active, the pulldown impedance increases, effectively decreasing the low time and increasing the duty cycle.

Figure 4:
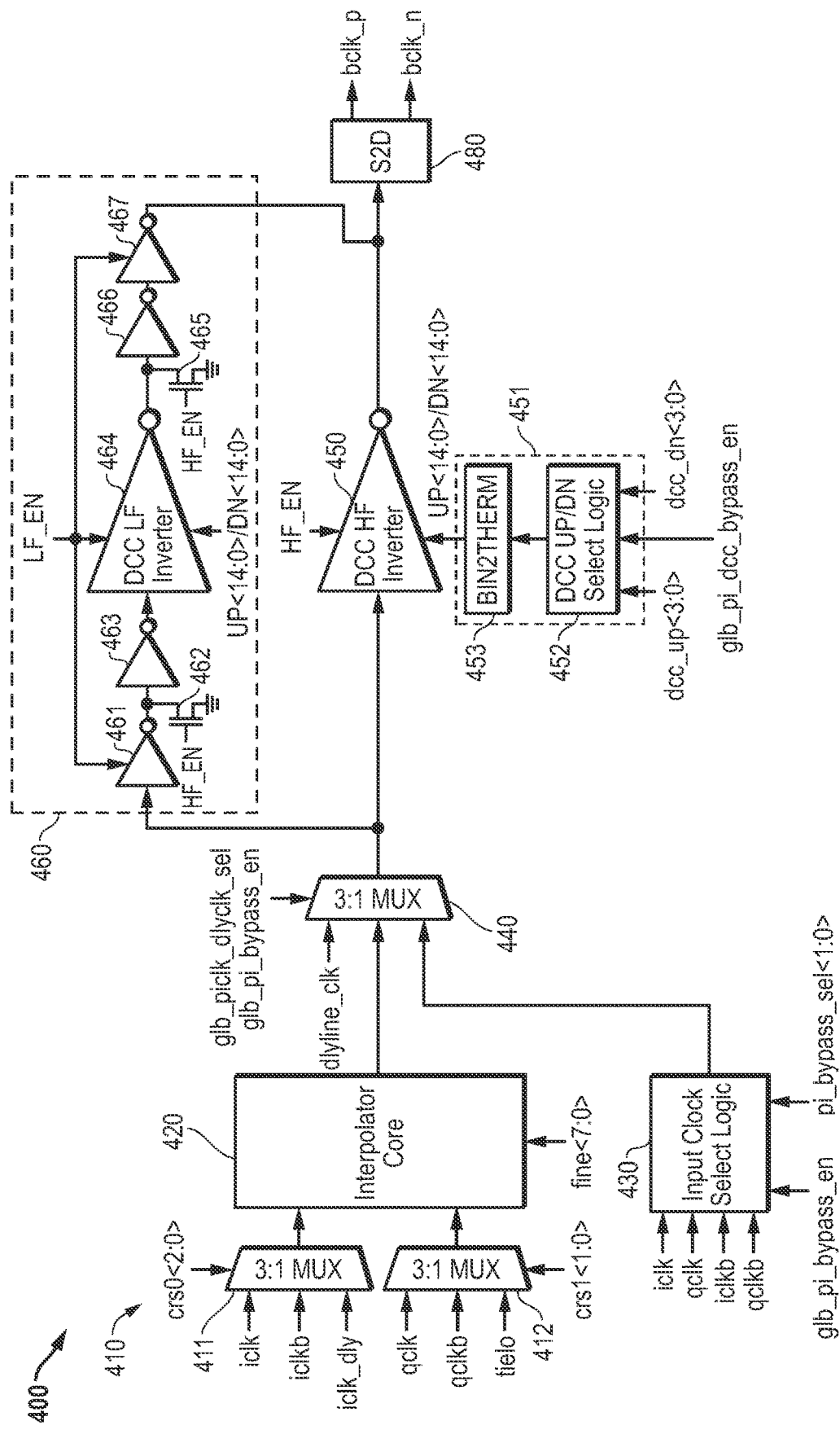
FIG. 4 illustrates in partial block diagram and partial schematic form a clock driver with duty cycle correction according to some embodiments.

FIG. 4 illustrates in partial block diagram and partial schematic form a clock driver 400 with duty cycle correction according to some embodiments. Clock driver 400 is similar to clock driver circuit 100 of FIG. 1 but does not include programmable divider 160. Clock driver 400 includes a selector block 410, an interpolator core 420, an input clock select logic circuit 430, a multiplexer 440 labelled "MUX", and a single-ended to differential converter 480 corresponding to like numbered elements in FIG. 1. There elements were discussed above and will not be described again.

However, clock driver 400 supports a wider range of operating frequencies than clock driver circuit 100 of FIG. 1 without programmable divider 160, and includes a driver circuit 450 implemented as a duty cycle correction inverter and a driver circuit 460 nested with driver circuit 450.

Driver circuit 460 includes a tri-state inverter 461, a transistor 462, an inverter 463, a duty cycle correction inverter 464, a transistor 465, an inverter 466 and a tri-state inverter 467. Tri-state inverter 461 has an input connected to the output of multiplexer 440, a control input for receiving the LF_EN signal, and an output. Transistor 462 has a drain connected to the output of tri-state inverter 461, a gate for receiving the HF_EN signal, and a source connected to the ground terminal. Inverter 463 has an input connected to the output of tri-state inverter 461, and an output. Duty cycle correction inverter 464 has an input connected to the output of inverter 463, a control input for receiving an enable signal labelled "LF_EN", a duty cycle correction input for receiving the UP<14:0> and DN<14:0> signals, and an output. Transistor 465 has a drain connected to the output of duty cycle correction inverter 464, a gate for receiving the HF_EN signal, and a source connected to the ground terminal. Inverter 466 has an input connected to the output of duty cycle correction inverter 464, and an output. Tri-state inverter 467 has an input connected to the output of inverter 466, a control input for receiving the LF_EN signal, and an output connected to the output of driver circuit 450.

In operation, clock driver 400 is a wideband clock driver that provides better correction over wider frequency ranges by providing two driver circuits with duty cycle correction tailored for different frequency ranges in parallel. Driver circuit 450 is active in response to the HF_EN signal and is active to provide duty cycle compensation for a first frequency range. Driver circuit 460 is active in response to the LF_EN signal and is active to provide duty cycle compensation for a second frequency range lower than the first frequency range.

Driver circuit 460 includes a tri-state inverter 461 and an inverter 463 on the input side of duty cycle correction inverter 464 to prevent adding loading to the node at the input of driver circuit 450. When LF_EN is low, driver circuit 460 is deselected, duty cycle correction inverter 464 and tri-state inverters 461 and 467 are all deselected. To prevent the input of inverter 463 from floating, transistor 462 receives the HF_EN signal and is activated to force the input of inverter 463 to a logic low state. Likewise, to prevent the input of inverter 466 from floating, transistor 465 receives the HF_EN signal and is activated to force the input of inverter 466 to a logic low state.

When LF_EN is high, HF_EN is low, and driver circuit 450 is inactive. Tri-state inverters 461 and 467, inverters 463 and 466 are active, and duty cycle correction inverter 464 is also active. Transistors 462 and 465 are non-conductive. The output of single-ended to differential converter 480 is provided from the low frequency path.

Driver circuit 460 is nested with driver circuit 450 as follows. It has an input and an output connected to the input and the output of driver circuit 450. However, it includes isolation to prevent loading the input terminal and contention on the output terminal of driver circuit 450 when driver circuit 450 is active. In this example, the isolation includes tri-state inverters 461 and 467, inverters 463 and 466, and transistors 462 and 465. As will now be shown, the nesting can be extended to an arbitrary number of layers to support better wideband duty cycle correction.

Figure 5:
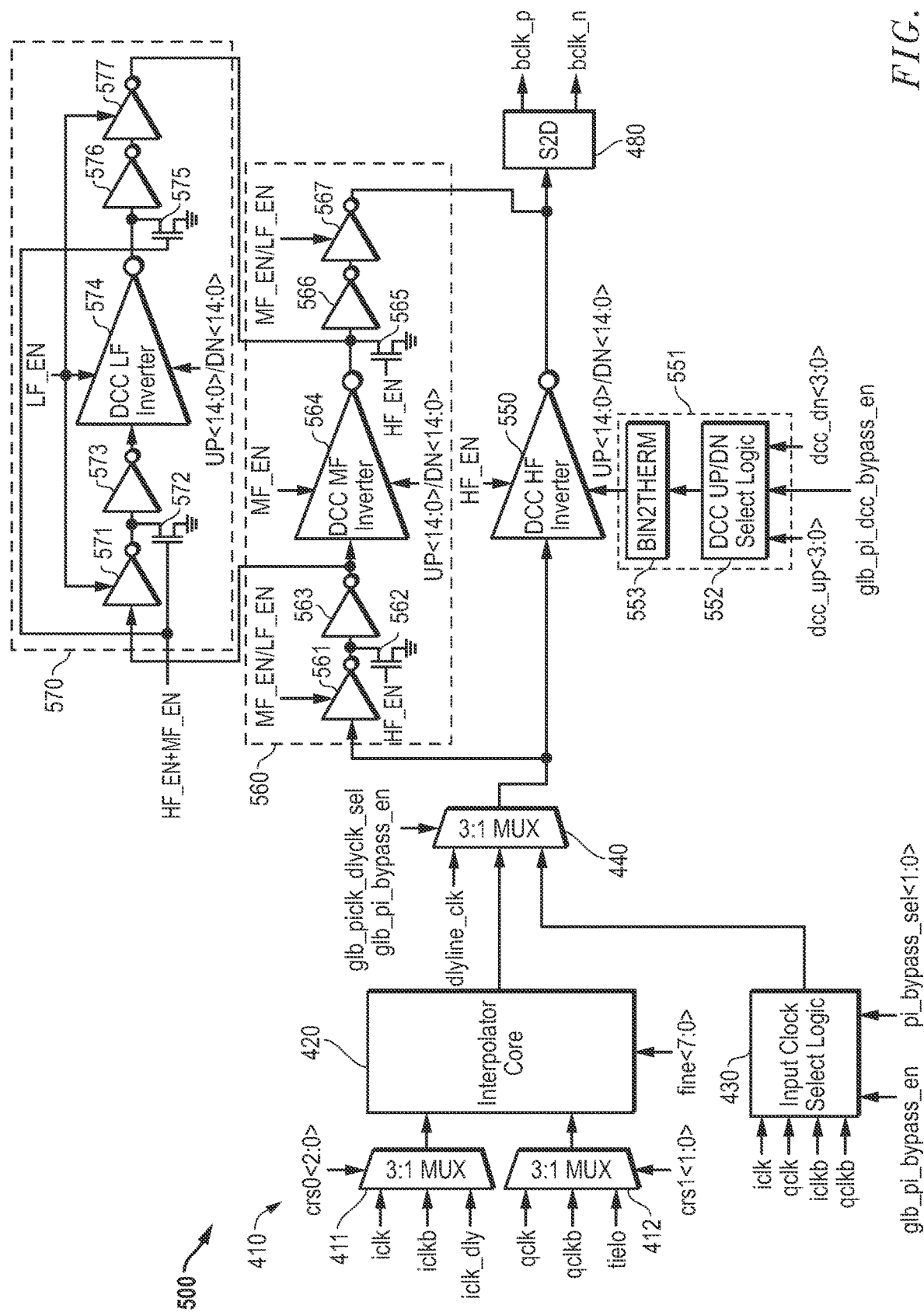
FIG. 5 illustrates in partial block diagram and partial schematic form another clock driver with duty cycle correction according to some embodiments.

FIG. 5 illustrates in partial block diagram and partial schematic form another clock driver 500 with duty cycle correction according to some embodiments. Clock driver 500 is a wideband clock driver similar to clock driver circuit 100 of FIG. 1 but it supports an even wider range of operating frequencies than clock driver circuit 100 of FIG. 1 without a programmable divider by nesting a third driver circuit 570 with a second driver circuit 560 and the first driver circuit 550. Clock driver 500 is constructed the same as clock driver 400, except it uses a combination of a first driver circuit 550, a second driver circuit 560, and a third driver circuit 570.

Duty cycle correction inverter 550 has an input connected to the output of multiplexer 440, an output, a control input for receiving the HF_EN signal, and a duty cycle correction input for receiving signals for controlling P- and N-channel transistors DN<14:0> and "UP<14:0>", respectively. A signal generator circuit 551 associated with driver circuit 550 includes a duty cycle control up/down selection logic circuit 552 and a binary-to-thermometer encoder circuit 553. Duty cycle control up/down selection logic circuit 552 has a first input for receiving the dcc_up<3:0> signal, a second input for receiving the dcc_dn<3:0> signal, a control input for receiving the dcc_pi_dcc_bypass_en signal, and an output. Binary-to-thermal converter 553 has an input connected to the output of duty cycle control up/down selection logic circuit 552, and an output for providing the UP<14:0> and DN<14:0> signals.

Driver circuit 560 includes a tri-state inverter 561, a transistor 562, an inverter 563, a duty cycle correction inverter 564, a transistor 565, an inverter 566, and a tri-state inverter 567. Tri-state inverter 561 has an input connected to the output of multiplexer 440, a control input for receiving an enable signal labelled "MF_EN/LF_EN", and an output. Transistor 562 has a drain connected to the output of tri-state inverter 561, a gate for receiving the HF_EN signal, and a source connected to the ground terminal. Inverter 563 has an input connected to the output of tri-state inverter 561, and an output. Duty cycle correction inverter 564 has an input connected to the output of inverter 563, a control input for receiving an enable signal labelled "MF_EN", a duty cycle correction input for receiving the UP<14:0> and DN<14:0> signals, and an output. Transistor 565 has a drain connected to the output of duty cycle correction inverter 564, a gate for receiving the HF_EN signal, and a source connected to the ground terminal. Inverter 566 has an input connected to the output of duty cycle correction inverter 564, and an output. Tri-state Inverter 567 has an input connected to the output of inverter 566, a control input for receiving an enable signal labelled "MF_EN+LF_EN", and an output connected to the output of driver circuit 550.

Driver circuit 570 includes a tri-state inverter 571, a transistor 572, an inverter 573, a duty cycle correction inverter 574, a transistor 575, an inverter 576, and a tri-state inverter 577. Tri-state Inverter 571 has an input connected to the output of inverter 563, a control input for receiving the LF_EN signal, and an output. Transistor 572 has a drain connected to the output of tri-state inverter 571, a gate for receiving an enable signal labelled "HF_EN+MF_EN", and a source connected to the ground terminal. Inverter 573 has an input connected to the output of tri-state inverter 571, and an output. Duty cycle correction inverter 574 has an input connected to the output of inverter 573, a control input for receiving the LF_EN signal, a duty cycle correction input for receiving the UP<14:0> and DN<14:0> signals, and an output. Transistor 575 has a drain connected to the output of duty cycle correction inverter 574, a gate for receiving the HF_EN+MF_EN signal, and a source connected to the ground terminal. Inverter 576 has an input connected to the output of duty cycle correction inverter 574, and an output. Tri-state inverter 577 has an input connected to the output of inverter 576, a control input for receiving the LF_EN signal, and an output connected to the output of duty cycle correction inverter 564.

By including three levels of driver circuits with three different frequency ranges, clock driver 500 avoids the LSB step size problem over even greater ranges of clock frequency. Clock drivers 400 and 500 illustrate the pattern that can be used to extend the number of frequency ranges.

Figure 6:
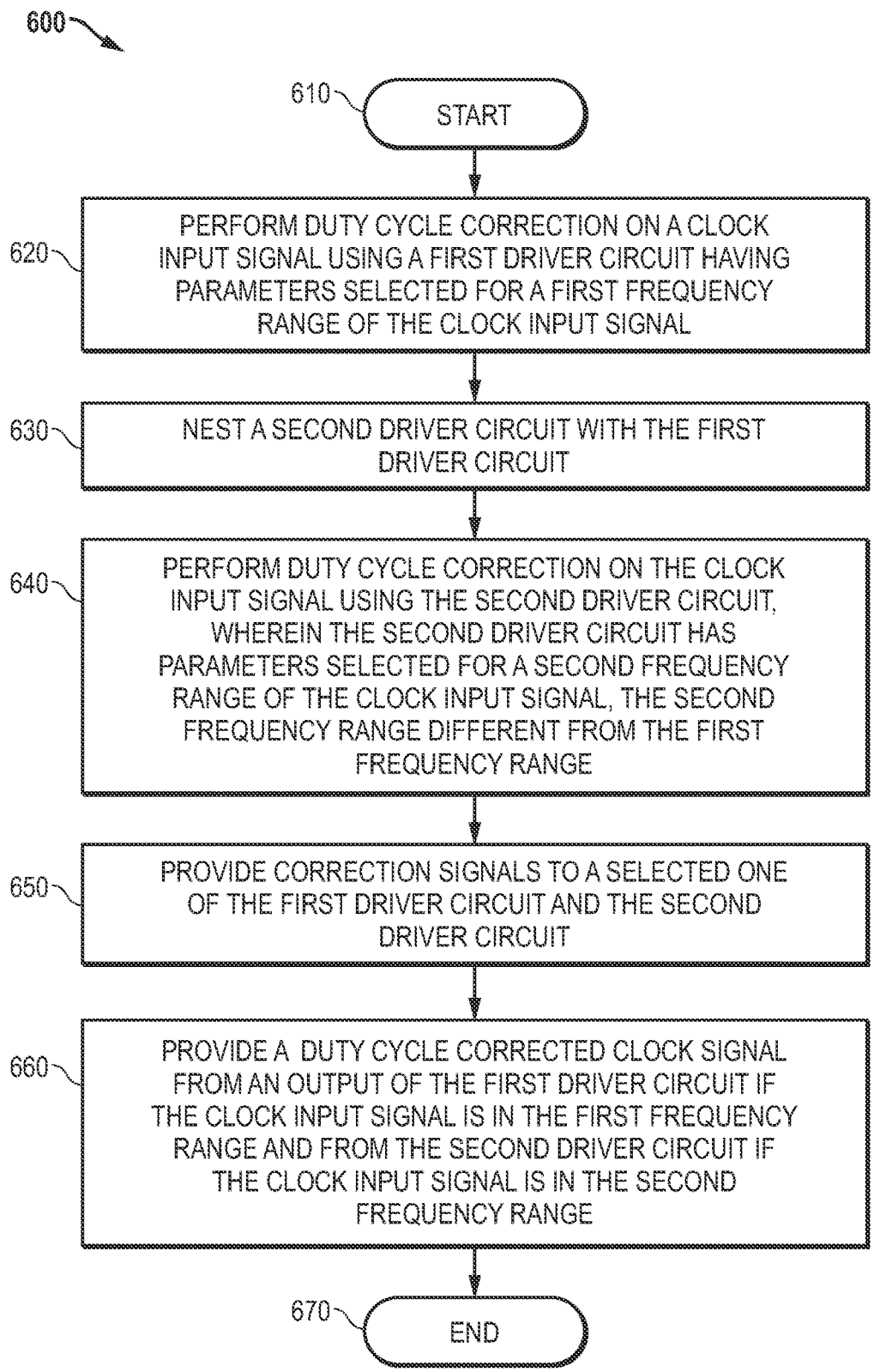
FIG. 6 illustrates a flow chart of a process of performing duty cycle correction on a clock input signal according to some embodiments.

FIG. 6 illustrates a flow chart of a process 600 of performing duty cycle correction on a clock input signal according to some embodiments. Process 600 starts in an action box 610. An action box 620 includes performing duty cycle correction on a clock input signal using a first driver circuit (e.g., driver circuit 550) having parameters selected for a first frequency range of the clock input signal. An action box 630 includes nesting a second driver circuit (e.g., driver circuit 560) with the first driver circuit (e.g., driver circuit 550). An action box 640 includes performing duty cycle correction on the clock input signal using the second driver circuit (e.g., driver circuit 560), wherein the second driver circuit (e.g., driver circuit 560) has parameters selected for a second frequency range of the clock input signal, the second frequency range different from the first frequency range. An action box 650 includes providing correction signals to a selected one of the first driver circuit (e.g., driver circuit 550) and the second driver circuit (e.g., driver circuit 560). An action box 660 includes providing a duty cycle corrected clock signal from an output of the first driver circuit (e.g., driver circuit 550) if the clock input signal is in the first frequency range and from the second driver circuit (e.g., driver circuit 560) if the clock input signal is in the second frequency range. Process 600 ends in an action box 670.

Thus, a wideband clock driver solves the LSB step size problem by including nested clock driver circuits to operate in different frequency ranges. The wideband clock driver provides various benefits and advantages compared to the conventional clock driver with duty cycle correction. First, it corrects duty cycle errors over a wide frequency range. Second, it is area efficient. Third, it provides significant performance and power benefits. Fourth, it allows the extension of protection against the LSB problem to and arbitrarily wide frequency range. Fifth, any nested stage provides minimal loading on the clock input signal. Sixth, it provides tunable range coverage and step size based on system requirements.

While particular embodiments have been described, various modifications to these embodiments will be apparent to those skilled in the art. The duty cycle corrected clock driver circuit can be advantageously integrated with other circuits, such as an interpolator, to provide a desirable combination of functions. While the exemplary embodiment was a DDR memory interface, the duty cycle correction logic can be used in a variety of other applications in which clock drivers are used or needed. The number of nested duty cycle correction circuits can also be varied in different embodiments, because the architecture supports an arbitrary number of nested clock driver circuits operating in different frequency bands.

Accordingly, it is intended by the appended claims to cover all modifications of the disclosed embodiments that fall within the scope of the disclosed embodiments.

What is claimed is:

1. A clock driver with duty cycle correction, comprising:
a first driver circuit for performing duty cycle correction on a clock input signal and having parameters selected for a first frequency range of the clock input signal;
a second driver circuit nested with the first driver circuit for performing duty cycle correction on the clock input signal with parameters selected for a second frequency range of the clock input signal lower than the first frequency range; and
a duty cycle correction circuit for providing correction signals to a selected one of the first driver circuit and the second driver circuit,
wherein the clock driver provides a duty cycle corrected clock signal from the selected one of the first driver circuit and the second driver circuit based on a selected frequency range of the clock input signal.

2. The clock driver of claim 1, wherein the second frequency range is non-overlapping with respect to the first frequency range.

3. The clock driver of claim 2, wherein:
the first driver circuit is activated in response to a first control signal indicting that the clock input signal is in the first frequency range; and the second driver circuit is activated in response to a second control signal indicting that the clock input signal is in the second frequency range.

4. The clock driver of claim 1, wherein the duty cycle correction circuit comprises:
a reference voltage generator for providing a reference voltage at an average of a logic high voltage and a logic low voltage of the clock input signal;
a lowpass filter having an input for receiving the clock input signal, and an output;
a comparator having a first input for receiving the reference voltage, a second input for receiving the clock input signal, and an output; and
an accumulator coupled to the output of the comparator, having a first output for providing an accumulated up count signal, and a second output for providing an accumulated down count signal,
wherein the selected one of the first driver circuit and the second driver circuit is responsive to the accumulated up count signal and the accumulated down count signal to provide the duty cycle corrected clock signal.

5. The clock driver of claim 1, further comprising:
a third driver circuit for performing duty cycle correction on the clock input signal with parameters selected for a third frequency range of the clock input signal lower that the first frequency range and the second frequency range,
wherein the third frequency range is non-overlapping with respect to both the first frequency range and the second frequency range.

6. The clock driver of claim 1, wherein each of the first driver circuit and the second driver circuit comprises an inverter.

7. The clock driver of claim 6, wherein the inverter of each of the first driver circuit and the second driver circuit comprises:
a first stage comprising:
a pullup transistor having a first current electrode coupled to a first power supply voltage terminal, a control electrode for receiving the clock input signal, and a second current electrode coupled to an output terminal that provides the duty cycle corrected clock signal through a first cascode transistor whose conductivity is selected in response to a pulldown correction signal; and
a pulldown transistor having a first current electrode coupled to the output terminal through a second cascode transistor whose conductivity is selected in response to a pullup correction signal, a control electrode for receiving the clock input signal, and a second current electrode coupled to a second power supply voltage terminal.

8. A clock driver with duty cycle correction, comprising:
a first driver circuit for performing duty cycle correction on a clock input signal with parameters selected for a first frequency range of the clock input signal;
at least one nested driver circuit coupled to and nested with a preceding driver circuit, each for performing duty cycle correction on the clock input signal with parameters selected for corresponding additional frequency ranges of the clock input signal; and
a duty cycle correction circuit for providing correction signals to the first driver circuit and the at least one nested driver circuit,
wherein the clock driver provides a duty cycle corrected clock signal from a selected one of the first driver circuit and the at least one nested driver circuit based on a frequency range of the clock input signal.

9. The clock driver of claim 8, wherein:
the first driver circuit comprises a duty cycle correction inverter having an input for receiving the clock input signal, and an output.

10. The clock driver of claim 9, wherein each of the at least one nested driver circuit comprises:
a first tri-state inverter having an input, a tri-state control input, and an output;
a first inverter having an input coupled to the output of the first tri-state inverter, and an output;
a duty cycle correction inverter having an input coupled to the output of the first inverter, a control input for receiving a duty cycle correction signal, an enable input for receiving a corresponding frequency range enable signal, and an output;
a second inverter having an input coupled to the output of the duty cycle correction inverter, and an output; and
a second tri-state inverter having an input coupled to the output of the second inverter, and an output for providing the duty cycle corrected clock signal.

11. The clock driver of claim 10, wherein:
each of the first tri-state inverter and the second tri-state inverter receives an enable signal that is active when either the corresponding frequency range enable signal is active or a subsequent frequency range enable signal is active.

12. The clock driver of claim 10, wherein:
the first tri-state inverter of a first one of the at least one nested driver circuit has an input coupled to an input of the duty cycle correction inverter of the first driver circuit; and
the second tri-state inverter of the first one of the at least one nested driver circuit has an output coupled to the output of the duty cycle correction inverter of the first driver circuit.

13. The clock driver of claim 12, wherein:
the first tri-state inverter of each additional one of the at least one nested driver circuit has an input coupled to an input of the duty cycle correction inverter of a previous driver circuit; and
the second tri-state inverter of each additional one of the at least one nested driver circuit has an output coupled to the output of the duty cycle correction inverter of the previous driver circuit.

14. The clock driver of claim 8, wherein:
the first driver circuit is activated in response to the clock input signal being in the first frequency range; and
each of the at least one nested driver circuit is activated in response to the clock input signal being in a corresponding additional frequency range, wherein the first frequency range and each corresponding additional frequency range are non-overlapping with respect to each other.

15. The clock driver of claim 8, wherein the duty cycle correction circuit comprises:
a reference voltage generator for providing a reference voltage at an average of a logic high voltage and a logic low voltage of the clock input signal;
a lowpass filter having an input for receiving the clock input signal, and an output;
a comparator having an inverting input for receiving the reference voltage, a non-inverting input for receiving the clock input signal, and an output; and
an accumulator coupled to the output of the comparator, having a first output for providing an accumulated up count signal, and a second output for providing an accumulated down count signal, wherein the first driver circuit and each of the at least one nested driver circuit are responsive to the accumulated up count signal and the accumulated down count signal to selectively provide the duty cycle corrected clock signal.

16. A method, comprising:

performing duty cycle correction on a clock input signal using a first driver circuit having parameters selected for a first frequency range of the clock input signal;

nesting a second driver circuit with the first driver circuit;

performing duty cycle correction on the clock input signal using the second driver circuit, wherein the second driver circuit has parameters selected for a second frequency range of the clock input signal, the second frequency range different from the first frequency range;

providing correction signals to a selected one of the first driver circuit and the second driver circuit; and providing a duty cycle corrected clock signal from an output of the first driver circuit if the clock input signal is in the first frequency range and from the second driver circuit if the clock input signal is in the second frequency range.

17. The method of claim 16, further comprising:

nesting a third driver circuit within the second driver circuit;

performing duty cycle correction on the clock input signal with parameters selected for a third frequency range of the clock input signal, the third frequency range different from the first frequency range and the second frequency range; and providing the duty cycle corrected clock signal from an output of the third driver circuit if the clock input signal is in a third frequency range.

18. The method of claim 16, further comprising:

forming the parameters of the first frequency range and the parameters from the second frequency range in response to measuring a duty cycle of the clock input signal.

19. The method of claim 18, wherein forming the parameters comprises:

providing a reference voltage at an average of a logic high voltage and a logic low voltage of the clock input signal;

lowpass filtering the clock input signal to form a lowpass filtered clock input signal;

comparing the lowpass filtered clock input signal to the reference voltage;

providing an accumulated up count signal in response to the lowpass filtered clock input signal being less than the reference voltage; and providing an accumulated down count signal in response to the lowpass filtered clock input signal being greater than the reference voltage.

20. The method of claim 19, further comprising:

modifying a duty cycle of a selected driver circuit based on the accumulated up count signal and the accumulated down count signal.

* * * * *